United States Patent
Dirnecker et al.

(10) Patent No.: US 8,470,683 B2
(45) Date of Patent: Jun. 25, 2013

(54) METHOD AND ELECTRONIC DEVICE FOR A SIMPLIFIED INTEGRATION OF HIGH PRECISION THINFILM RESISTORS

(75) Inventors: Christoph Dirnecker, Eching (DE); Wolfgang Ploss, Mauern (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/032,426

(22) Filed: Feb. 22, 2011

(65) Prior Publication Data
US 2011/0204482 A1 Aug. 25, 2011

(30) Foreign Application Priority Data
Feb. 23, 2010 (DE) .......... 10 2010 008 942

(51) Int. Cl.
H01L 29/86 (2006.01)
H01L 21/02 (2006.01)

(52) U.S. Cl.
USPC .......... 438/384; 257/536; 257/E21.004; 257/E29.325

(58) Field of Classification Search
None
See application file for complete search history.

(56) References Cited

U.S. PATENT DOCUMENTS

| | | | |
|---|---|---|---|
| 6,365,480 B1* | 4/2002 | Huppert et al. | 438/381 |
| 6,653,713 B2 | 11/2003 | Takasu | |
| 6,734,076 B1* | 5/2004 | Jaiswal et al. | 438/384 |
| 7,112,286 B2* | 9/2006 | Vialpando et al. | 216/18 |
| 7,202,533 B1* | 4/2007 | Beach et al. | 257/363 |
| 7,224,040 B2* | 5/2007 | Koutsaroff et al. | 257/535 |
| 7,345,573 B2* | 3/2008 | Beach | 338/9 |
| 8,093,679 B2* | 1/2012 | Chinthakindi et al. | 257/516 |
| 2009/0017591 A1* | 1/2009 | Cervin-Lawry et al. | 438/384 |
| 2009/0065898 A1* | 3/2009 | Chinthakindi et al. | 257/536 |

OTHER PUBLICATIONS

El-Kareh, B, et. al., "A 5V complementary-SiGe BiCMOS technology for high-speed precision analog circuits," IEEE Proceedings of the Bipolar/BiCMOS Circuits and Technology Meeting, 2003, pp. 211-214, Sep. 28-30, 2003.*

* cited by examiner

*Primary Examiner* — Thomas L Dickey
*Assistant Examiner* — Joseph Schoenholtz
(74) *Attorney, Agent, or Firm* — Jacqueline J. Garner; Wade J. Brady, III; Frederick J. Telecky, Jr.

(57) ABSTRACT

The invention relates to a method of manufacturing an integrated circuit. An electrically resistive layer of a material for serving as a thin film resistor (TFR) is deposited. A first electrically insulating layer is deposited on the electrically resistive layer of the TFR. An electrically conductive layer of an electrically conductive material is deposited. An area is left without the conductive layer and the area overlaps the electrically resistive layer of the TFR. A second electrically insulating layer is deposited on top of the conductive layer. A first VIA opening is etched through the second insulating layer, the area without the conductive layer adjacent to the electrically conductive layer and through the first insulating layer down to the electrically resistive layer of the TFR. A conductive material is deposited in the first VIA opening so as to electrically connect the conductive layer and the electrically resistive layer of the TFR.

7 Claims, 11 Drawing Sheets

METHOD AND ELECTRONIC DEVICE FOR A SIMPLIFIED INTEGRATION OF HIGH PRECISION THINFILM RESISTORS

FIELD OF THE INVENTION

The invention relates to a method for integrating a high precision thin film resistor (TFR) and an electronic device with a high precision thin film resistor.

BACKGROUND

Existing methods and electronic devices employ up to 3 additional mask levels in order to integrate high precision thin film resistors (TFRs) having sufficient accuracy and matching characteristics.

Figure 11:
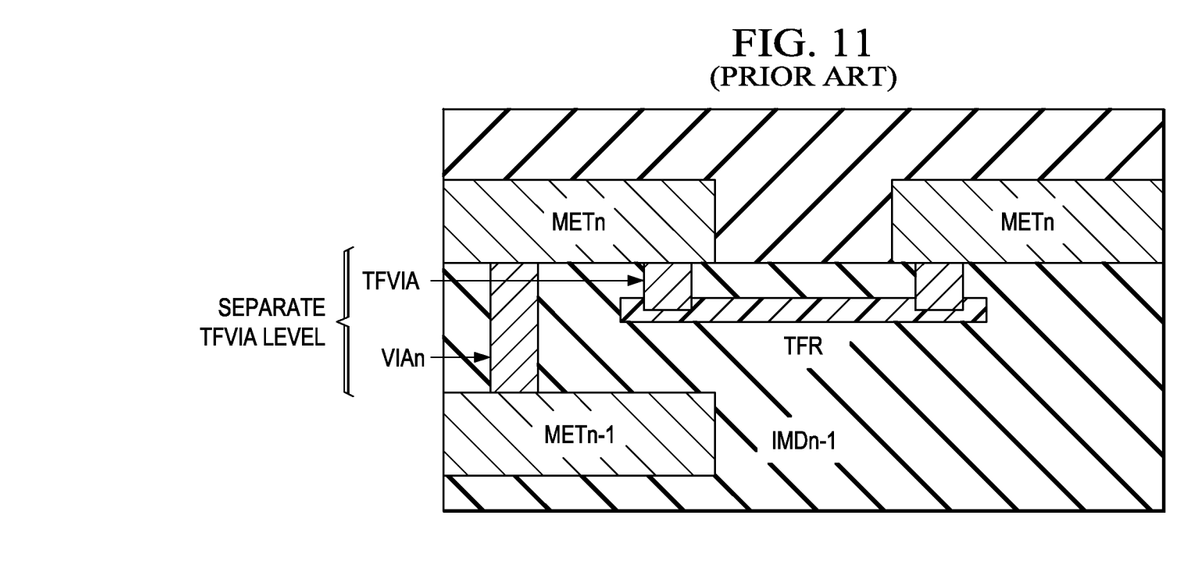
FIG. 11 is a cross-sectional diagram of a prior art TFR.

FIG. 11 is a simplified schematic of an integrated circuit with a thin film resistor which is manufactured according to the prior art. The thin resistive layer of the TFR is embedded in an insulating IMDn–1 layer and is connected to a conductive METn layer with shallow VIAs referred to as TFVIA. The shallow connection adds only a low parasitic value to the resistance of the TFR. A deeper VIAn connects the METn layer to the METn–1 layer of the circuit interconnection. Due to the sensitivity of the thin resistive layer to overetching, two separate photo- and etching sequences are used for the shallow TFVIA and the deeper VIAn. This method requires at least 2 additional mask levels in the BEOL process to integrate the TFR.

However, any additional mask level renders the process flow more complex and expensive. Solutions using fewer mask levels either result in lower resistor performance or in an interact with the baseline interconnect processes. Thin film resistors are usually made of NiCr or SiCr alloys and they are typically located between two consecutive metallization levels. In order to prevent erosion of the thin resistor film during typical etching processes while at the same time providing a shallow connection with low parasitic resistance, either a separate thin film resistor head or a separate thin film VIA or both are usually provided.

SUMMARY

It is an object of the invention to provide a method and an electronic device with a thin film resistor using less mask levels than prior art methods and electronic devices for implementing the thin film resistor and achieving the same matching and parasitic characteristics.

According to an aspect of the invention, a method of manufacturing an integrated circuit is provided. A thin electrically resistive layer of a material for serving as a thin film resistor (TFR) is deposited and structured. Further, a first electrically insulating layer is deposited on top of the electrically resistive layer of the TFR. An electrically conductive layer of an electrically conductive material is deposited on top of the first electrically insulating layer. An area that overlaps the electrically resistive layer of the TFR is left free from the conductive layer. A second electrically insulating layer is deposited on top of the first insulating layer and conductive layer. A first VIA opening is etched through the second insulating layer and through the area without the conductive layer. The first VIA opening is provided adjacent to the electrically conductive layer and through the first insulating layer down to the electrically resistive layer of the TFR. A conductive material is deposited in the first VIA opening so as to electrically connect the conductive layer and the electrically resistive layer of the TFR. This aspect of the invention provides that the connection between the conductive layer and the resistive layer of the TFR is short although the VIA is comparably deep. The parasitics of the interconnection between the conductive layer and the resistive layer of the TFR are therefore rather small. In this way, the resistor film is buried within a pre-metal dielectric (PMD) or inter-metal dielectric (IMD) level underneath but close to a metallization level (MET). The thickness of the first insulating layer between the resistor film and the first conductive layer may then be designed and implemented as thin as possible but still strong enough to survive metal overetch oxide-loss. The resistive layer may not immediately be connected to the conductive layer by a shallow and specific thin film resistor VIA. Instead of using a separate thin film resistor VIA, slotted metal connection pads may be designed into the first conductive layer such that a slot or opening in the first conductive layer can be aligned with respect to the resistive layer of the TFR.

According to an aspect of the invention, a second VIA opening may be etched through the second insulating layer for connecting the conductive layer. The same single mask may then be used for the first VIA opening and the second VIA opening. This provides that only a single mask can be used for two different types of VIAs. The first VIA may reach through the first and the second insulating layer and the conductive layer, while the second VIA may only reach to the conductive layer. The second VIA opening may then be shallower than the first VIA opening. However, the connection between the conductive layer and the resistive layer of the TFR can be kept as short as necessary.

In an embodiment of the invention, a width of the first VIA opening above the conductive layer may be greater than a width of the opening (also referred to as a slot) through the conductive layer. This provides that process of connecting the second VIA to the conductive layer and the resistive layer of the TFR is self aligning.

The conductive layer may be designed to withstand the etching process. The conductive layer is inherently more stable and resistant to the etching process than the resistive layer of the TFR but specific parameters may be adjusted to ensure that it withstands the etching process. In an aspect of the invention, an etch stop layer may be deposited on top of the conductive layer. Compared with conventional methods, the invention shifts the problem of erosion during the etching process from the resistive layer of the TFR to the conductive layer.

According to another aspect of the invention, the width of the first VIA may be greater than the width of the resistive layer of the TFR. This aspect of the invention provides that the resistive layer of the TFR can be connected to the conductive layer over its full width which decreases parasitic resistance.

According to another aspect of the invention, an electronic device may be provided. The electronic device may have a first VIA reaching through a first insulating layer and a second insulating layer and a conductive layer between the first insulating layer and the second insulating layer for connecting a resistive layer of a TFR with the conductive layer.

BRIEF DESCRIPTION OF DRAWINGS

Further aspects and characteristics of the invention will ensue from the following description of preferred embodiments of the invention with reference to the accompanying drawings, wherein.

DETAILED DESCRIPTION OF PREFERRED EMBODIMENTS

FIGS. 1, 3, 5, 7 and 9 show simplified schematics of top views (upper part) and corresponding cross sections (lower part) of consecutive steps of stages of manufacture of an electronic device according to aspects of the invention. FIGS. 2, 4, 6, 8 and 10 show simplified schematics of top views (upper part) and corresponding cross sections (lower part) of the steps shown in FIGS. 1, 3, 5, 7, and 9, respectively, but from a view perpendicular to the length of the TFR.

Figure 1:
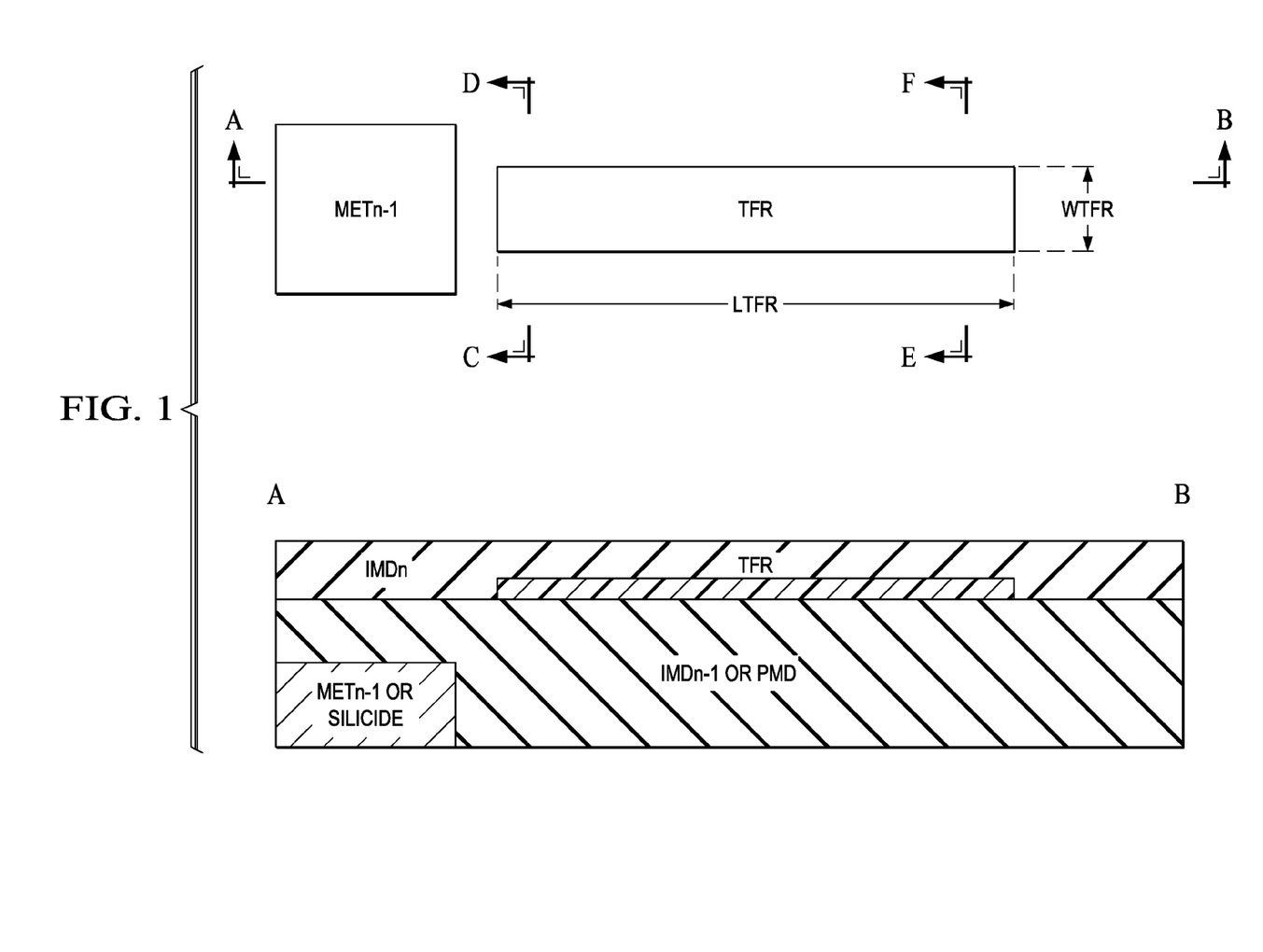
FIG. 1 is a simplified schematic of a stage of manufacture of an integrated circuit having a thin film resistor according to an embodiment of the invention from a view parallel to the length of the TFR.
Figure 2:
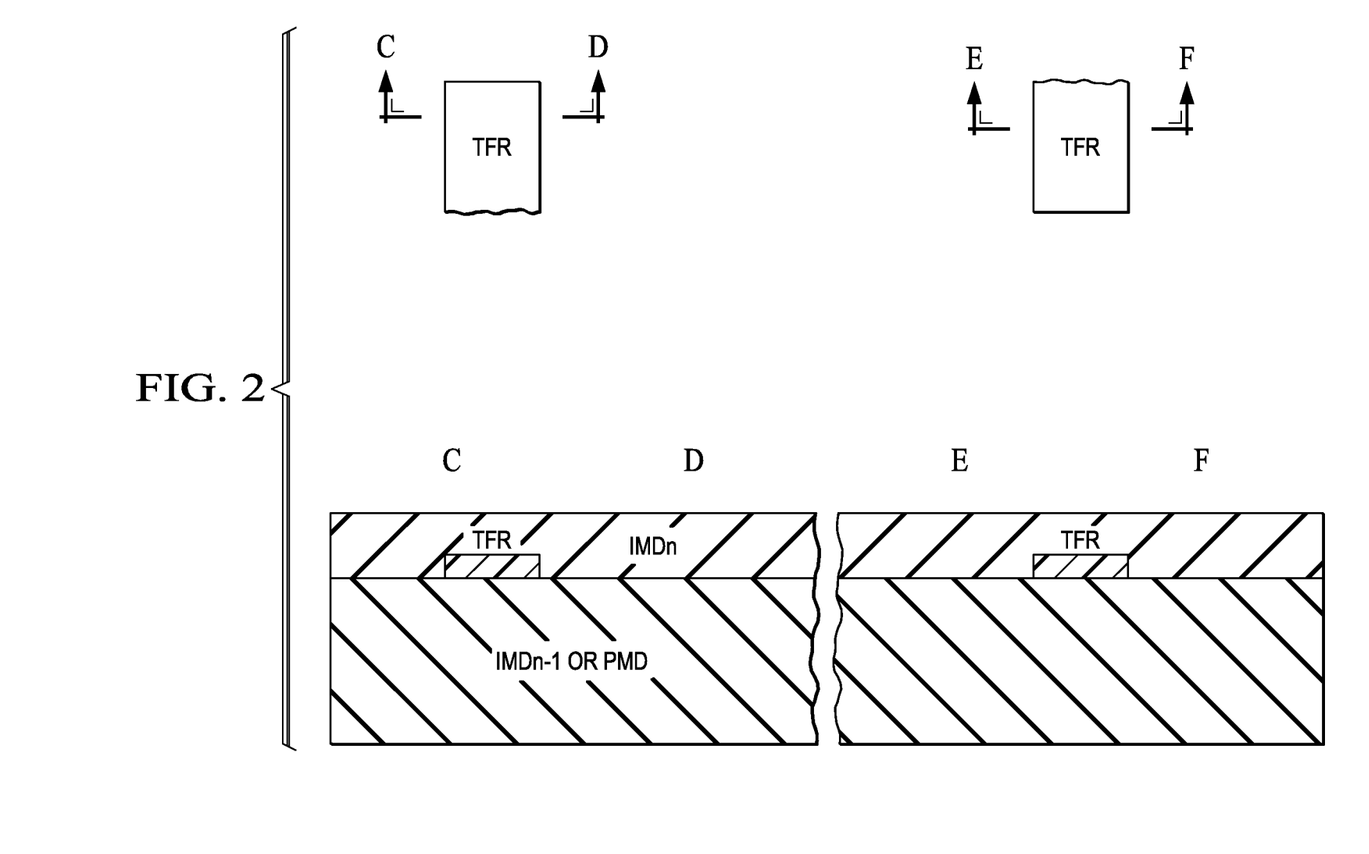
FIG. 2 is a simplified schematic of the stage of manufacture shown in FIG. 1 from a view perpendicular to the length of the TFR.

FIG. 1 shows a simplified schematic of a stage of manufacture of an integrated circuit according to an embodiment of the invention from a view parallel to the length of the TFR. The corresponding top view and cross-sections of FIG. 1 are shown in FIG. 2. A metal layer METn−1 or silicide layer is arranged in an inter-metal dielectric IMDn−1 or a pre-metal dielectric PMD. The upper part of the drawing shows a top view on a section of the electronic device while the lower part shows the corresponding cross-section. The cross-section of relates to the line connecting points A and B. The length of the TFR is LTFR and the width is WTFR.

FIG. 2 shows a simplified schematic of the same stage of manufacture shown in but from a view perpendicular to the length of the TFR which is indicated by the lines connecting points D and C and F and E. The upper part is a top view on the integrated circuit and the lower part a cross-section relating to the dashed lines connecting points C and D and E and F, respectively.

A resistive layer TFR (for example of an alloy like NiCr, NiCrAl or SiCr) is deposited and etched on top of the insulating layer IMDn−1/PMD and structured by conventional photolithographic steps. Another insulating layer is deposited on top of the TFR layer and the insulating layer IMDn−1/PMD. The TFR layer is now embedded in two insulating layers IMDn−1 and IMDn.

Figure 3:
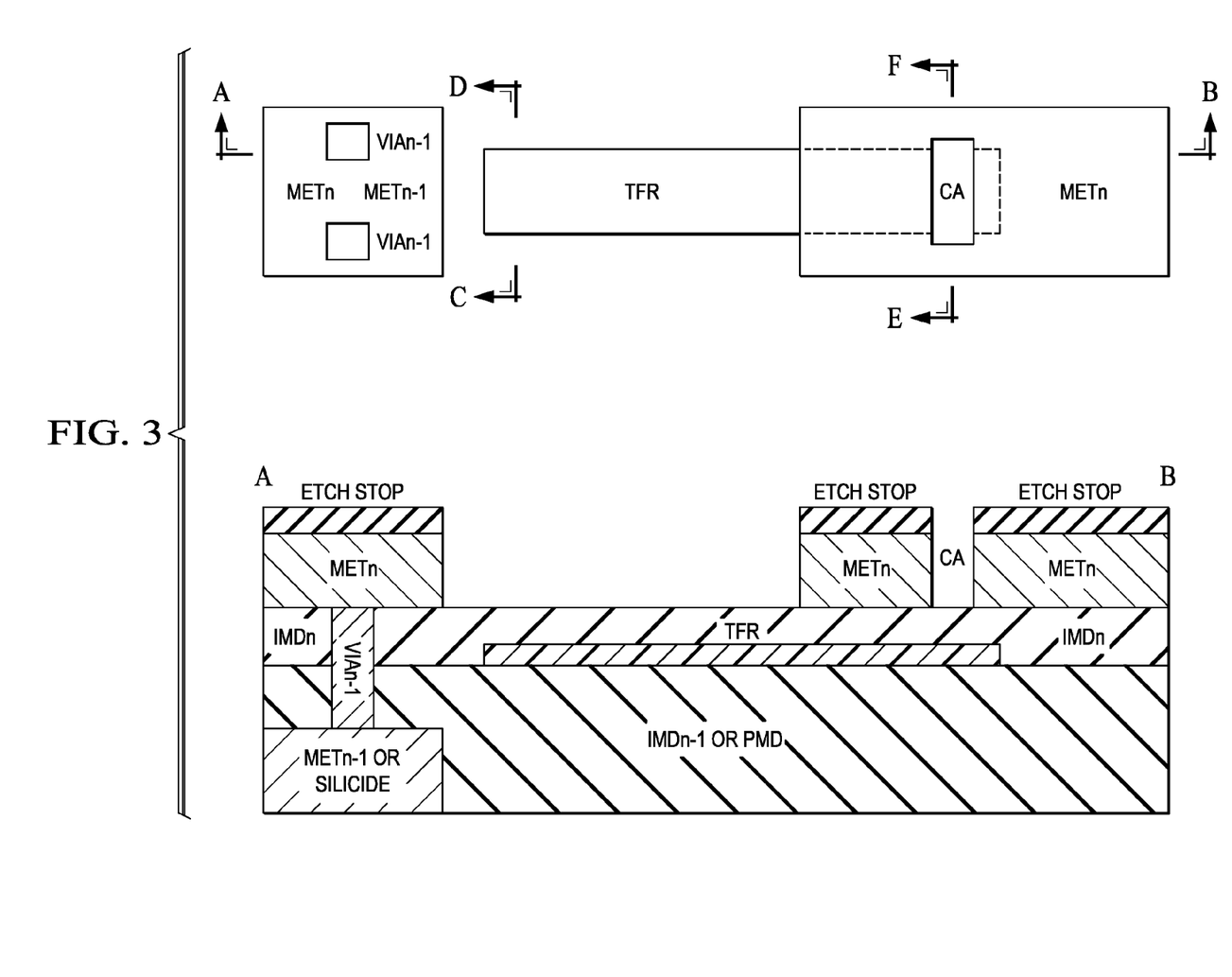
FIG. 3 is a simplified schematic of a stage of manufacture of an integrated circuit having a thin film resistor according to an embodiment of the invention from a view parallel to the length of the TFR.
Figure 4:
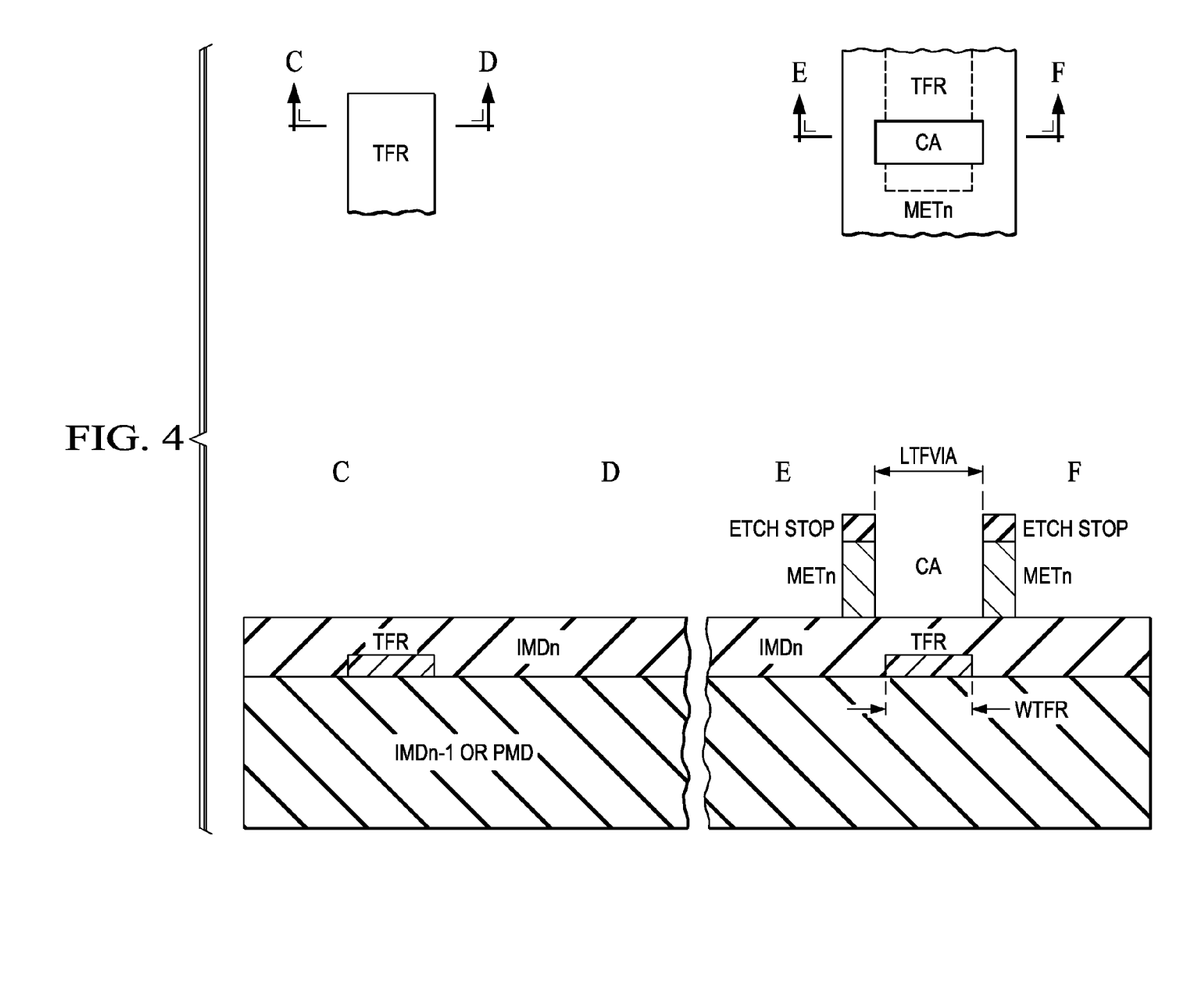
FIG. 4 is a simplified schematic of the stage of manufacture shown in FIG. 3 from a view perpendicular to the length of the TFR.

FIG. 3 and FIG. 4 show a further manufacturing step of the electronic device according to an embodiment of the invention from a view parallel to the length of the TFR from the two respective angles explained with respect to the previous figures. In this manufacturing step, a shallow VIA VIAn−1 (second VIA type) is etched through the insulating layer IMDn and IMDn−1/PMD in order to connect the conductive layer METn−1 or the silicide in the insulating layer IMDn−1/PMD.

A further conductive layer METn is deposited on top of the insulating layer IMDn. Furthermore, an etch stop layer is deposited on top of the conductive layer METn. A specific area CA is left free of the conductive layer METn. The area CA, which may also be referred to as a slot or an opening in the conductive layer METn is arranged above the resistive layer of the TFR. In other words, in the top views shown in the upper parts of FIG. 3 and FIG. 4, the area CA is arranged to overlap the resistive layer TFR. TFVIA may have a greater diameter LTFVIA in the slot CA where it passes through the conductive layer METn than the width WTFR of the TFR in order to provide a self-aligned process. The etch stop layer may be of TiN. The thickness of the etch stop layer may advantageously be chosen such that it can withstand a deep VIA overetch. The slotted metal connecting pad frame (CA) is designed into the metal level METn and aligned to the resistor film TFR underneath. The opening CA in the metal pad defines the connecting region for the resistor film TFR. If LTFVIA is greater than WTFR the connection area is maximum and therefore optimized.

Figure 5:
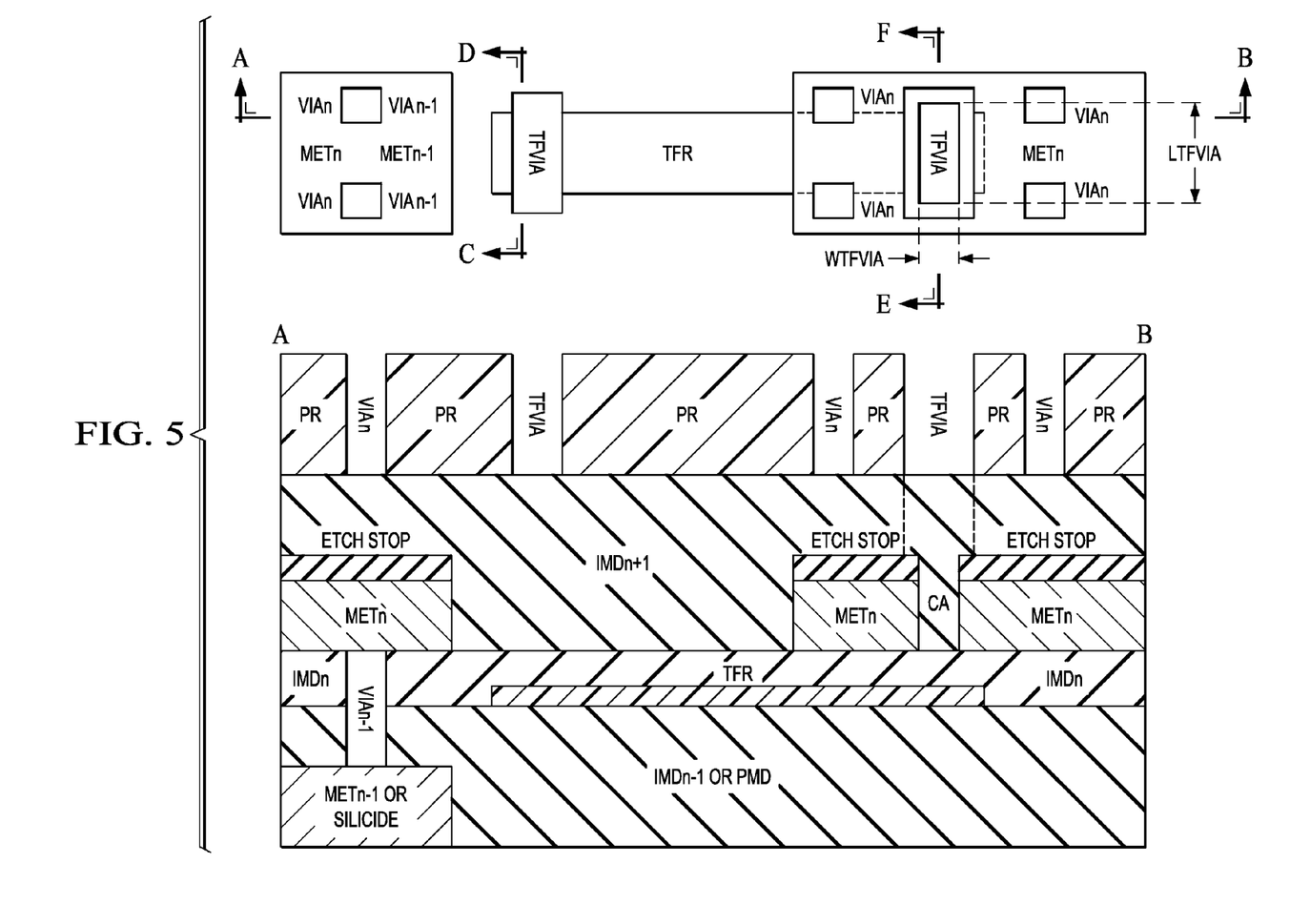
FIG. 5 is a simplified schematic of a stage of manufacture of an integrated circuit having a thin film resistor according to an embodiment of the invention from a view parallel to the length of the TFR.
Figure 6:
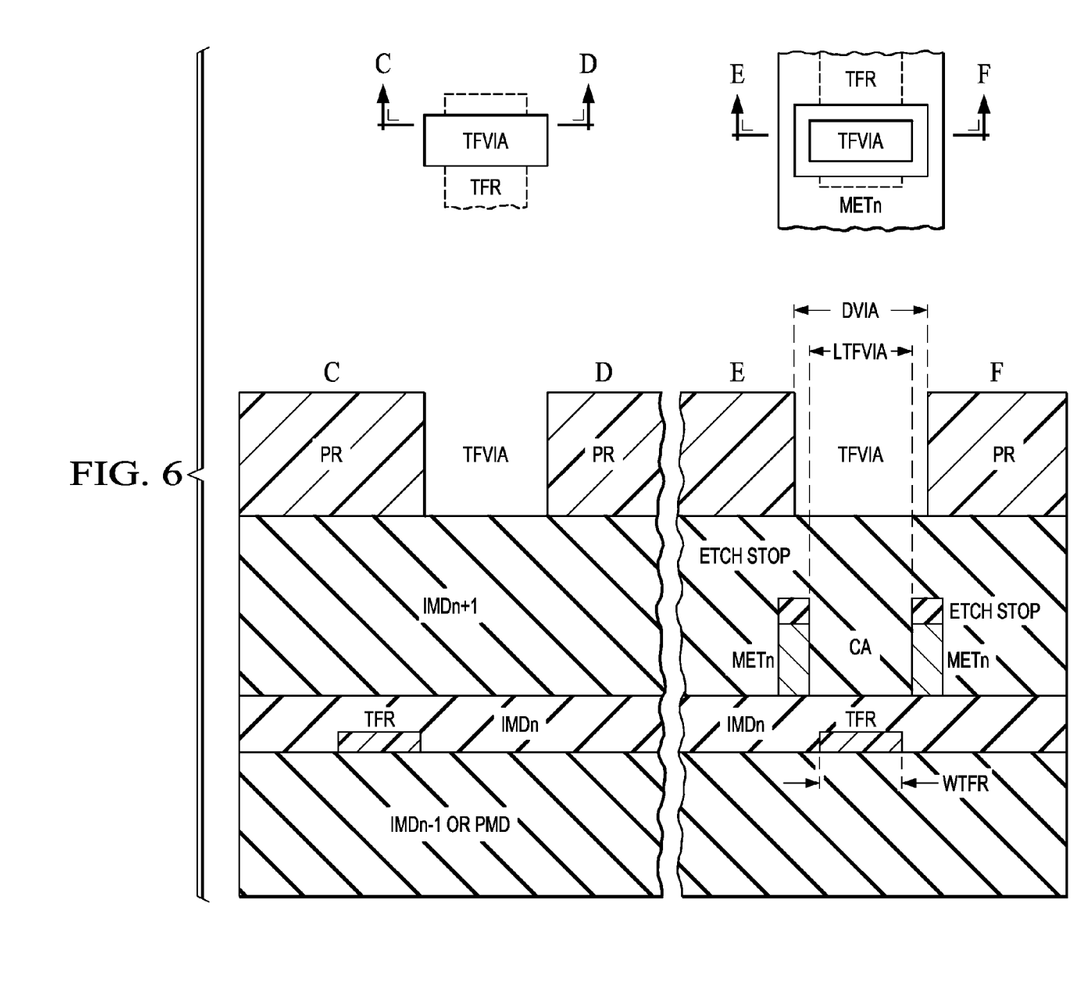
FIG. 6 is a simplified schematic of the stage of manufacture shown in FIG. 5 from a view perpendicular to the length of the TFR.

FIG. 5 and FIG. 6 show a further step of manufacture of the electronic device according to an embodiment of the invention from a view parallel to the length of the TFR. A further inter-metal dielectric IMDn+1 is deposited on top of the conductive layer METn (having the etch stop layer on top) and the inter-metal dielectric IMDn. A pattern (masking layer), for example with a photoresist PR is formed on top of the insulating layer IMDn+1. The pattern provides openings for deep VIAs TFVIA and shallow VIAs VIAn. The deep VIAs TFVIA are also referred to as the first VIAs in the context of the invention and the shallow VIAs VIAn are also referred to as the second VIAs. A single mask may advantageously be used for both types of VIAs, the deep VIAs TFVIA and the shallow VIAs VIAn. The shallow VIAs VIAn are designed to connect the conductive layer METn with an upper level, while the deep VIAs TFVIA are provided to reach through the insulating layer IMDn+1 and to connect the conductive layer METn with the resistive layer TFR. The diameter DVIA of the opening of the second VIA TFIA above the slot CA is greater than the diameter LTFVIA of the slot CA. This supports self-alignment of the interconnections. The diameter LTFVIA of the slot is greater than the diameter WTFR of the TFR. This supports optimized connection to the TFR with minimum resistance.

Figure 7:
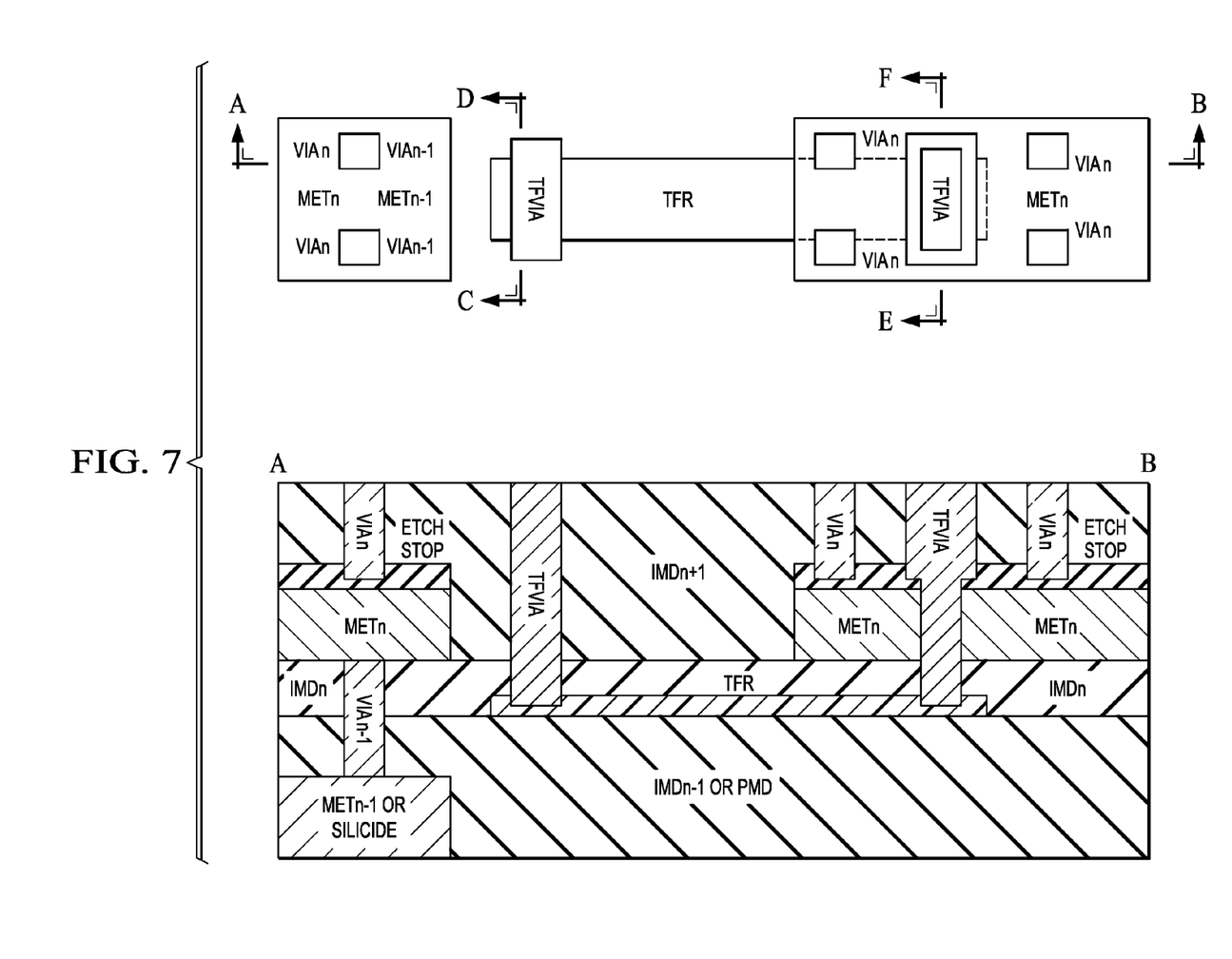
FIG. 7 is a simplified schematic of a stage of manufacture of an integrated circuit having a thin film resistor according to an embodiment of the invention from a view parallel to the length of the TFR.
Figure 8:
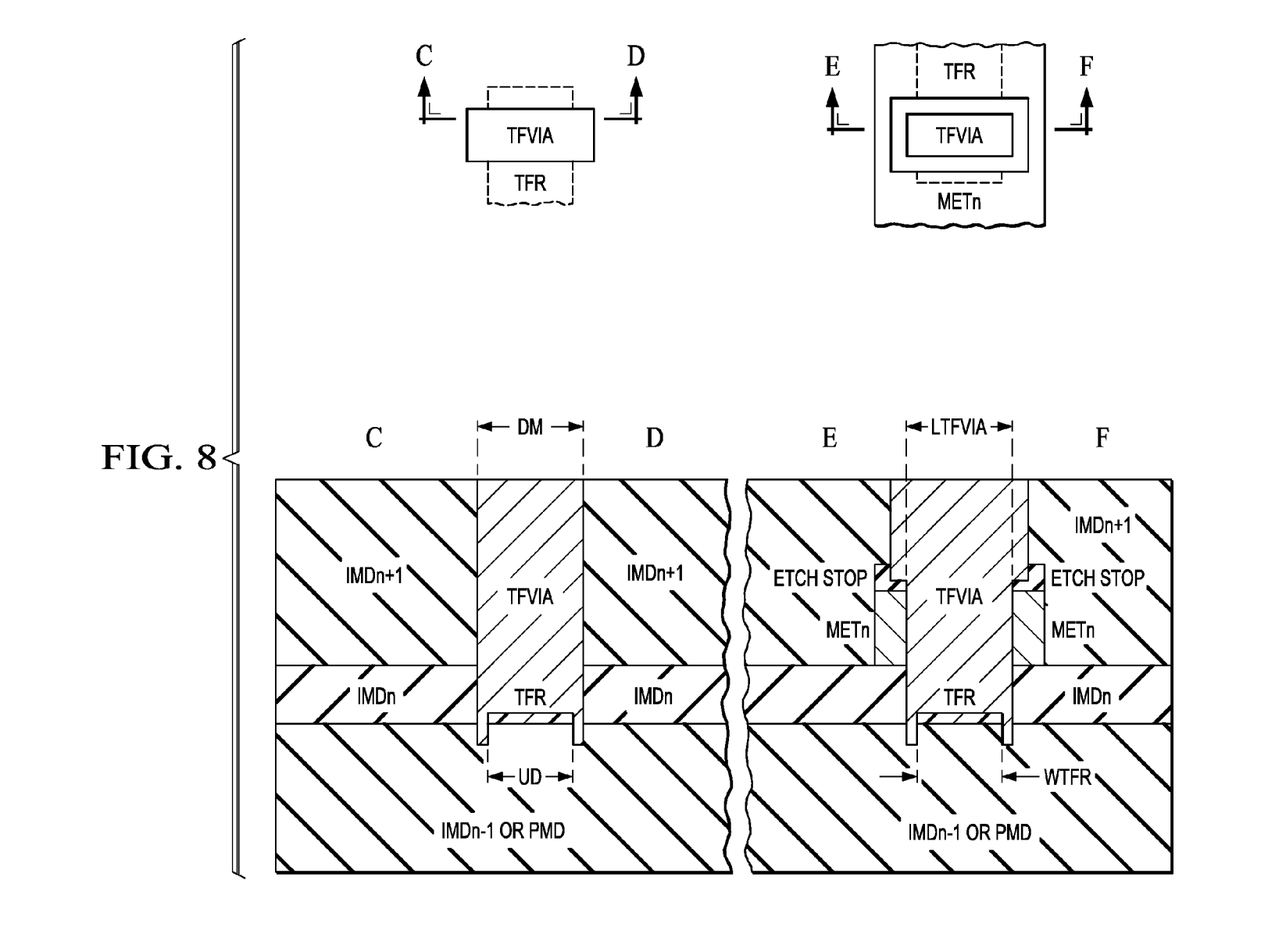
FIG. 8 is a simplified schematic of the stage of manufacture shown in FIG. 7 from a view perpendicular to the length of the TFR.

In FIG. 7 and FIG. 8, the process of etching the VIAs VIAn and TFVIA is shown. In a first etching step, all VIAs VIAn and TFVIA are etched to the level of the etch stop layer on top of the conductive layer METn. In the second step shown in FIG. 7 and FIG. 8, the deep VIAs TFVIA are etched from the level of the etch stop layer through the conductive layer METn, the insulating layer IMDn+1 and IMDn down to the resistive layer TFR. FIG. 8 shows that the diameter LTFVIA of the deep VIAs TFVIA is greater than the width WTFR of the TFR. This provides that the connection to the TFR spans more than the whole width WTFR of the TFR and therefore ensures that the resistance of the connection is minimized. The deep VIAs TFVIA are self-aligned to the resistor TFR by the slotted connections (areas CA) in the conductive layer METn.

Figure 9:
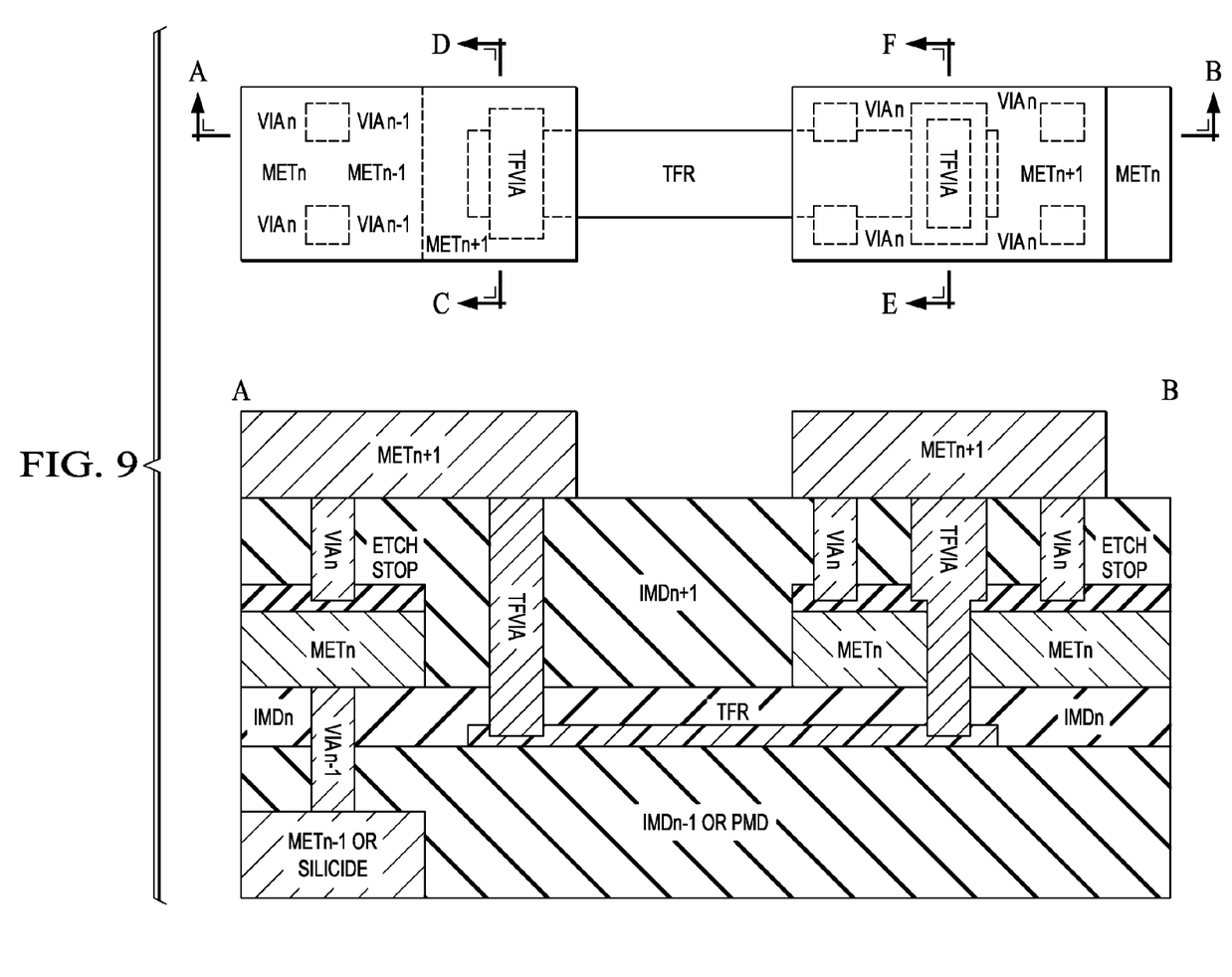
FIG. 9 is a simplified schematic of a stage of manufacture of an integrated circuit having a thin film resistor according to an embodiment of the invention from a view parallel to the length of the TFR.
Figure 10:
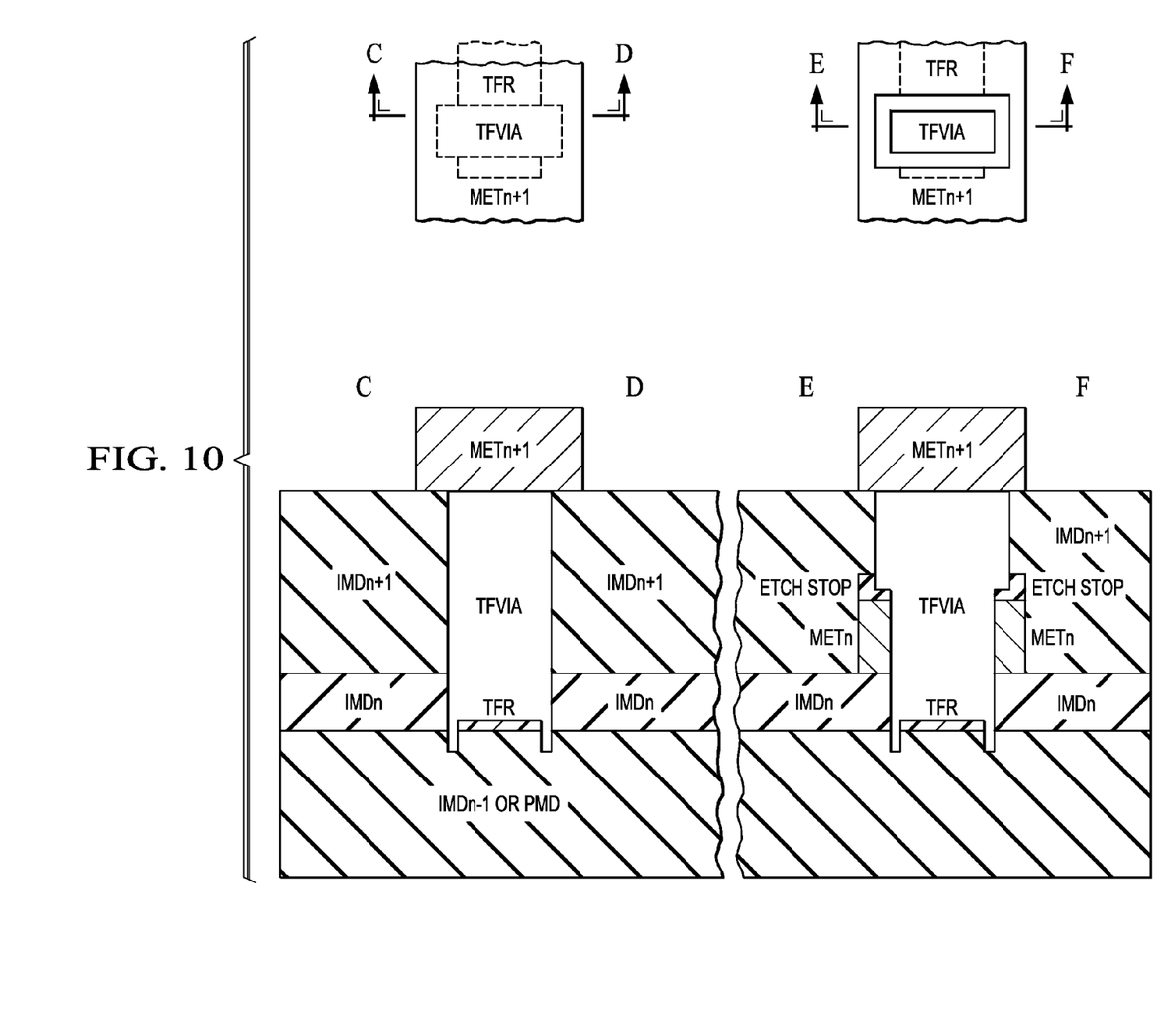
FIG. 10 is a simplified schematic of the stage of manufacture shown in FIG. 18 from a view perpendicular to the length of the TFR.

FIG. 9 and FIG. 10 show a further manufacturing step in which the photoresist PR is already removed. This step is referred to as VIA fill (also referred to as VIA plug fill). Tungsten (W) may be deposited in order to fill the VIAs (deep TFVIA and shallow VIAn) with a conductive material. The W-deposition is adjusted according to aspects of the invention in order to fill also the wider VIAs TFVIA. VIAs VIAn and TFVIA are filled with a conductive material in order to connect the resistive layer TFR with the conductive layer METn and to connect the conductive layer METn to the upper surface of the insulating layer IMDn+1. A CMP step may follow the step of filling the VIAs.

A further conductive layer METn+1 is deposited on top of the insulating layer IMDn+1 in order to connect the conductive material in the VIAs VIAn and TFVIA. Therefore, the resistive layer of the TFR (i.e. the thin film resistor TFR) can be connected to the top conductive layer METn+1. Furthermore, the conductive layer METn may be connected to the top conductive layer METn+1.

Although the invention has been described hereinabove with reference to a specific embodiment, it is not limited to this embodiment and no doubt further alternatives will occur to the skilled person that lie within the scope of the invention as claimed. For example, a slot CA in conductive layer METn may be used at both ends of the TFR instead of only one end as shown in the Figures.

The invention claimed is:

1. A method of manufacturing an integrated circuit, the method comprising:
    depositing and structuring an electrically resistive layer of a material for serving as a thin film resistor (TFR),
    depositing a first electrically insulating layer on the electrically resistive layer of the TFR,
    depositing a first conductive layer of an electrically conductive material,
    leaving an area without the first conductive layer overlapping the electrically resistive layer of the TFR,
    depositing a second electrically insulating layer on top of the first conductive layer,
    etching a first VIA opening through the second insulating layer, the area without the first conductive layer adjacent to the first conductive layer and through the first insulating layer down to the electrically resistive layer of the TFR, and
    depositing a conductive material in the first VIA opening to form a first via that directly electrically connects the first conductive layer and the electrically resistive layer of the TFR.

2. The method according to claim 1, further comprising etching a second VIA opening through the second insulating layer for connecting the conductive layer and using the same single mask for the first VIA opening and the second VIA opening.

3. The method according to claim 2, further comprising the step of forming a second conductive layer over the second insulating layer wherein the first VIA connects the second conductive layer to the resistive layer of the TFR and the second VIA opening connects the second conductive layer to the first conductive layer.

4. The method according to claim 1, wherein a width of the first VIA opening adjacent to the electrically conductive layer is greater than a width of the first VIA opening within the electrically conductive layer.

5. The method according to claim 1, further comprising depositing an etch stop layer on top of the first conductive layer.

6. A method of manufacturing an integrated circuit, the method comprising:
    depositing and structuring an electrically resistive layer of a material for serving as a thin film resistor (TFR),
    depositing a first electrically insulating layer on the electrically resistive layer of the TFR,
    depositing a first conductive layer of an electrically conductive material,
    leaving an area without the first conductive layer overlapping the electrically resistive layer of the TFR,
    depositing a second electrically insulating layer on top of the first conductive layer,
    etching a first VIA opening through the second insulating layer, the area without the first conductive layer adjacent to the first conductive layer and through the first insulating layer down to the electrically resistive layer of the TFR, and
    depositing a conductive material in the first VIA opening to form a first via that electrically connects the first conductive layer and the electrically resistive layer of the TFR, wherein a diameter of the first VIA is greater than a width of the electrically resistive layer of the TFR.

7. A method of manufacturing an integrated circuit, the method comprising:
    forming a first metal interconnect layer METn−1;
    forming a first insulating layer over METn−1;
    forming a resistive layer of a thin film resistor TFR embedded within the first insulating layer;
    forming a second metal interconnect layer METn over the first insulating layer, the second metal interconnect layer METn having a slot without conductive material overlying a portion of the TFR;
    forming a second insulating layer over METn;
    forming a masking layer over the second insulating layer;
    using said masking layer, forming both a first VIA opening and a second VIA opening, wherein the first VIA opening extends through the second insulating layer, the slot without conductive material in METn, and the first insulating layer to the resistive layer of TFR and the second VIA opening extends through the second insulating layer to METn;
    filling the first VIA opening and the second VIA opening with a conductive material to form a first VIA and a second VIA, respectively; and
    forming a third metal interconnect layer METn+1, wherein the first VIA connects METn+1 to the resistive layer of TFR through said slot and the second VIA connects METn+1 to METn, and wherein the first VIA is directly connected to METn within said slot.

* * * * *